(12) United States Patent
Sakai (10) Patent No.: US 10,755,158 B2
(45) Date of Patent: Aug. 25, 2020

(54) ELECTRIC CIRCUIT, COMMUNICATION DEVICE, AND METHOD FOR MANUFACTURING ELECTRIC CIRCUIT

(71) Applicant: SONY CORPORATION, Tokyo (JP)

(72) Inventor: Yuji Sakai, Saitama (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/744,981

(22) PCT Filed: May 24, 2016

(86) PCT No.: PCT/JP2016/065368
§ 371 (c)(1),
(2) Date: Jan. 15, 2018

(87) PCT Pub. No.: WO2017/018039
PCT Pub. Date: Feb. 2, 2017

(65) Prior Publication Data
US 2018/0211144 A1    Jul. 26, 2018

(30) Foreign Application Priority Data

Jul. 30, 2015  (JP) .................... 2015-150223

(51) Int. Cl.
*H05K 1/02* (2006.01)
*G06K 19/077* (2006.01)

(52) U.S. Cl.
CPC ..... *G06K 19/077* (2013.01); *G06K 19/07754* (2013.01); *H05K 1/0237* (2013.01); *H05K 2201/10098* (2013.01)

(58) Field of Classification Search
CPC .......... H05K 1/0237; G06K 19/07754; G06K 19/077
See application file for complete search history.

(56) References Cited

U.S. PATENT DOCUMENTS

2012/0018522 A1* 1/2012 Le Garrec ........ G06K 19/07749
235/492
2014/0152511 A1* 6/2014 Merlin ................. G06K 19/077
343/700 MS
(Continued)

FOREIGN PATENT DOCUMENTS

JP    2000-285211 A    10/2000
JP    2003-283120 A    10/2003
(Continued)

OTHER PUBLICATIONS

International Search Report and Written Opinion of PCT Application No. PCT/JP2016/065368, dated Aug. 2, 2016, 09 pages of ISRWO.

*Primary Examiner* — Hoa C Nguyen
*Assistant Examiner* — Keith DePew
(74) *Attorney, Agent, or Firm* — Chip Law Group (57) ABSTRACT

To provide an electric circuit, a communication device, and a method for manufacturing the electric circuit to maintain or improve connection reliability while suppressing increase in manufacturing costs. The electric circuit includes a connecting unit that electrically connects an antenna coil and an integrated circuit (IC) chip. The connecting unit includes a first partial connecting unit that is electrically connected to the antenna coil, and a second partial connecting unit that is electrically connected to the first partial connecting unit and the IC chip to be arranged and that is made of a material different from a material of the first partial connecting unit.

9 Claims, 9 Drawing Sheets (56) References Cited

U.S. PATENT DOCUMENTS

2015/0324683 A1* 11/2015 Linfield ........... G06K 19/07769
                                                        235/492
2016/0099214 A1*  4/2016 Dalal ................. H01L 23/3121
                                                        257/692
2016/0365644 A1* 12/2016 Finn ....................... B23K 26/40
2017/0203657 A1*  7/2017 Ludwig .................. B60L 53/38

FOREIGN PATENT DOCUMENTS

| JP | 2003283120 A | * | 10/2003 |
| JP | 2011-034398 A | | 2/2011 |
| JP | 2014-032510 A | | 2/2014 |
| JP | 2014032510 A | * | 2/2014 |
| JP | 2015-114754 A | | 6/2015 |
| WO | 2010/004644 A1 | | 1/2010 |

* cited by examiner

ELECTRIC CIRCUIT, COMMUNICATION DEVICE, AND METHOD FOR MANUFACTURING ELECTRIC CIRCUIT

CROSS REFERENCE TO RELATED APPLICATIONS

This application is a U.S. National Phase of International Patent Application No. PCT/JP2016/065368 filed on May 24, 2016, which claims priority benefit of Japanese Patent Application No. JP 2015-150223 filed in the Japan Patent Office on Jul. 30, 2015. Each of the above-referenced applications is hereby incorporated herein by reference in its entirety.

TECHNICAL FIELD

The present disclosure relates to an electric circuit, a communication device, and a method for manufacturing an electric circuit.

BACKGROUND ART

In recent years, communication devices that perform non-contact communication with a reader/writer have been in widespread use. Such communication devices are referred to as, for example, integrated circuit (IC) cards, wireless IC tags, radio frequency identification (RFID) tags, or the like.

Among the communication devices that perform non-contact communication, a communication device, which is disclosed in Patent Literature 1 for example and includes an IC chip which performs reading and writing of data and the like, an antenna, and a wiring which connects the IC chip and the antenna, is known.

CITATION LIST

Patent Literature

Patent Literature 1: JP2011-34398A

DISCLOSURE OF INVENTION

Technical Problem

However, with a conventional communication device as a representative communication device disclosed in Patent Literature 1, it is difficult to establish both reliability (hereinafter, also referred to as the connection reliability) for connection between an IC chip and an antenna and suppression of increase in manufacturing costs. For example, in the case of using copper for a wiring for connecting the IC chip and the antenna, generally, copper is more expensive than another metal that may be used. Therefore, the manufacturing costs of the communication device thereof tend to be high. On the other hand, in the case of using the aforementioned other metal that may be used, e.g., aluminum, for the wiring, the other metal that may be used is cheaper than the copper in many cases. However, the connectivity of the surface of the other metal that may be used is more inferior to that of the copper in many cases, and therefore the connection reliability tends to be low.

Consequently, in the present disclosure, an electric circuit, a communication device, and a method for manufacturing the electric circuit with novelty and improvement are proposed to maintain or improve the connection reliability while suppressing the increase in manufacturing costs.

Solution to Problem

According to the present disclosure, there is provided an electric circuit including a connecting unit that electrically connects an antenna coil and an integrated circuit (IC) chip. The connecting unit includes a first partial connecting unit that is electrically connected to the antenna coil, and a second partial connecting unit that is electrically connected to the first partial connecting unit and the IC chip to be arranged and that is made of a material different from a material of the first partial connecting unit.

In addition, according to the present disclosure, there is provided a communication device including: an antenna coil; an integrated circuit (IC) chip; and a connecting unit that electrically connects the antenna coil and the IC chip. The connecting unit includes a first partial connecting unit that is electrically connected to the antenna coil, and a second partial connecting unit that is electrically connected to at least a part of the first partial connecting unit and at least a part of the IC chip to be arranged and that is made of a material different from a material of the first partial connecting unit.

In addition, according to the present disclosure, there is provided a method for manufacturing an electric circuit, the method including: forming an antenna coil and a first partial connecting unit that is electrically connected to the antenna coil; and forming a second partial connecting unit that is electrically connected to at least a part of the first partial connecting unit and at least a part of the IC chip to be arranged, by applying a material different from a material of the first partial connecting unit to the first partial connecting unit.

Advantageous Effects of Invention

As described above, according to the present disclosure, an electric circuit, a communication device, and a method for manufacturing the electric circuit are provided to maintain or improve the connection reliability while suppressing the increase in manufacturing costs. Note that the effects described above are not necessarily limitative. With or in the place of the above effects, there may be achieved any one of the effects described in this specification or other effects that may be grasped from this specification.

MODE(S) FOR CARRYING OUT THE INVENTION

Hereinafter, preferred embodiments of the present disclosure will be described in detail with reference to the appended drawings. In this specification and the appended drawings, structural elements that have substantially the same function and structure are denoted with the same reference numerals, and repeated explanation of these structural elements is omitted.

Note that a description will be given in the following order.
1. Problem of conventional art
2. Communication device and electric circuit according to an embodiment of the present disclosure
    2-1. Configuration of electric circuit
    2-2. Configuration of communication device
    2-3. Method for manufacturing electric circuit in communication device
3. Conclusion

1. PROBLEM OF CONVENTIONAL ART

Figure 1:
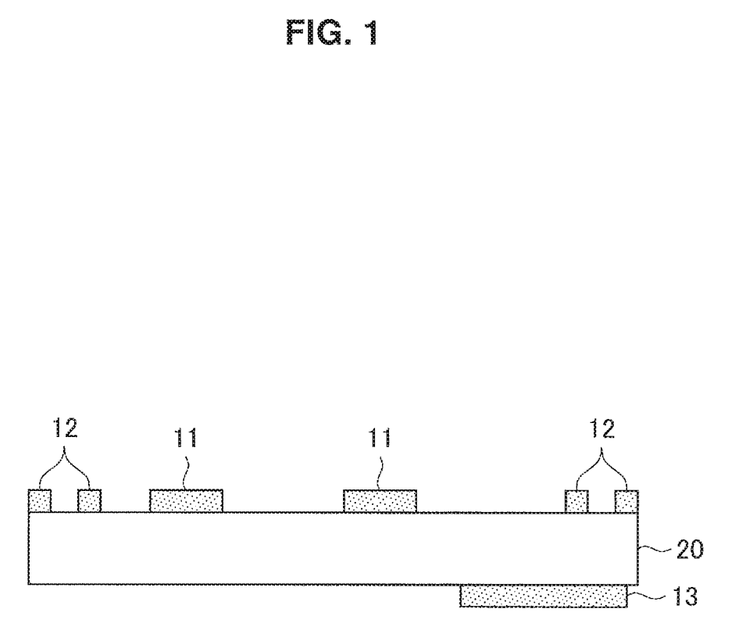
FIG. 1 is a cross-sectional schematic diagram of an electric circuit in a conventional communication device.

First, a description will be given of a conventional communication device and a problem of the conventional communication device with reference to FIG. 1. FIG. 1 is a cross-sectional schematic diagram of an electric circuit in the conventional communication device.

As illustrated in FIG. 1, the electric circuit in the conventional communication device includes a connecting unit 11, an antenna coil 12, a bridge unit 13, and a film 20.

The connecting unit 11 electrically connects the antenna coil 12 and an IC chip. The antenna coil 12 generates electric power in the electric circuit with electromagnetic induction. The bridge unit 13 connects one end of the antenna coil 12 to the connecting unit 11 formed on a front surface via a rear surface on the opposite side, sandwiching the film 20 of the electric circuit.

In a step of manufacturing the conventional communication device, the electric circuit is embedded into a card. The card is cut, thereby exposing the connecting unit 11 in the electric circuit from the card. Then, the IC chip is crimped to the exposed connecting unit 11.

Herein, in the electric circuit in the conventional communication device, in the case where the communication device is one IC chip and is a so-called dual card having contact and non-contact communication interfaces, the connecting unit 11, the antenna coil 12, and the bridge unit 13 contain a material including copper. This is because the connection reliability between the IC chip and the antenna coil 12 is ensured. However, since the copper is more expensive than another metal that may be used, manufacturing costs of the conventional communication device may be high.

For example, in the case of a so-called hybrid card with two IC chips having contact and non-contact communication interfaces or a single-function card having only one of the contact and non-contact communication interfaces, the electric circuit includes a material having aluminum as the other metal that may be used. In this case, the aluminum is cheaper than the copper and manufacturing costs of the cards are therefore lower than that of the dual card. However, the aluminum is more easily oxidized than the copper, an oxidized film is therefore generated on the surface, and the connection reliability of the aluminum is lower than that of the copper.

Consequently, in the present disclosure, an electric circuit and a communication device are provided to make it possible to maintain or improve the connection reliability while suppressing the increase in manufacturing costs. Hereinbelow, a specific description will be given of a communication device according to an embodiment of the present disclosure.

2. COMMUNICATION DEVICE ACCORDING TO AN EMBODIMENT OF THE PRESENT DISCLOSURE

The problems of conventional communication device and the conventional communication device have been described above. Next, a description will be given of a communication device and an electric circuit 100 of the communication device according to an embodiment of the present disclosure.

<2-1. Configuration of Electric Circuit>

Figure 2:
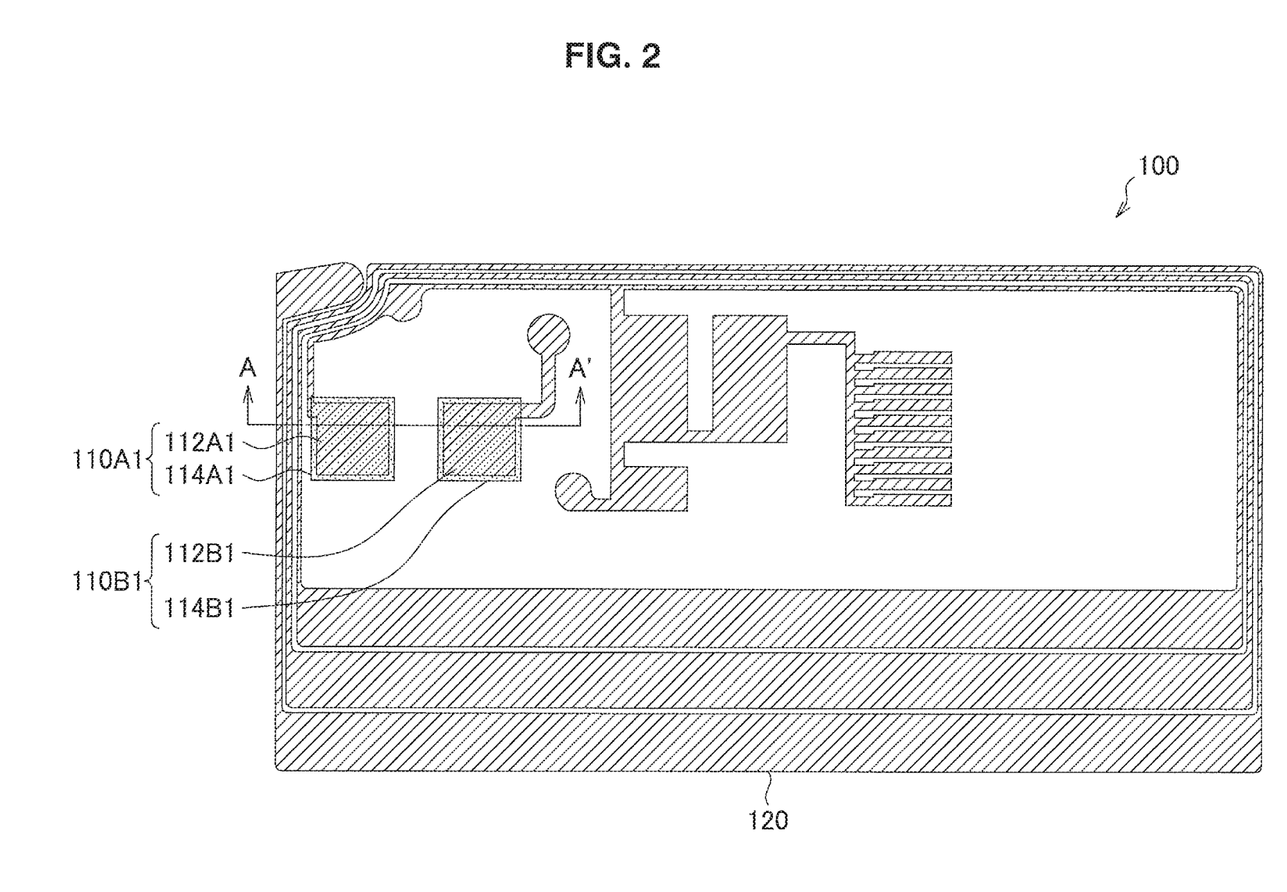
FIG. 2 is a circuitry diagram schematically illustrating an example of an electric circuit in a communication device according to an embodiment of the present disclosure.

First, a description will be given of the electric circuit 100 in the communication device according to an embodiment of the present disclosure with reference to FIG. 2. FIG. 2 is a circuitry diagram schematically illustrating an example of the electric circuit 100 of the communication device according to an embodiment of the present disclosure.

As illustrated in FIG. 2, the electric circuit 100 includes a connecting unit 110 and an antenna coil 120.

An IC chip is mounted on the connecting unit 110, and the connecting unit 110 electrically connects the IC chip and the antenna coil 120. The connecting unit 110 includes a basic portion 112 and an external edge portion 114.

The basic portion 112 is electrically connected to the antenna coil 120 as a first partial connecting unit. Specifically, the basic portion 112 includes a basic portion 112A1 and a basic portion 112B1 that are electrically connected to each end of the antenna coil 120, respectively. For example, as illustrated in FIG. 2, the basic portion 112 includes the basic portion 112A1 and the basic portion 112B1 that are formed like pad shape to which the IC chip is set. The basic portion 112A1 and the basic portion 112B1 are physically and electrically connected to the corresponding each end of the antenna coil 120, respectively.

Further, the material of the basic portion 112 contains aluminum. For example, the basic portion 112 is formed by etching an aluminum material containing aluminum. Note that the basic portion 112 may be formed by paste printing.

Figure 3:
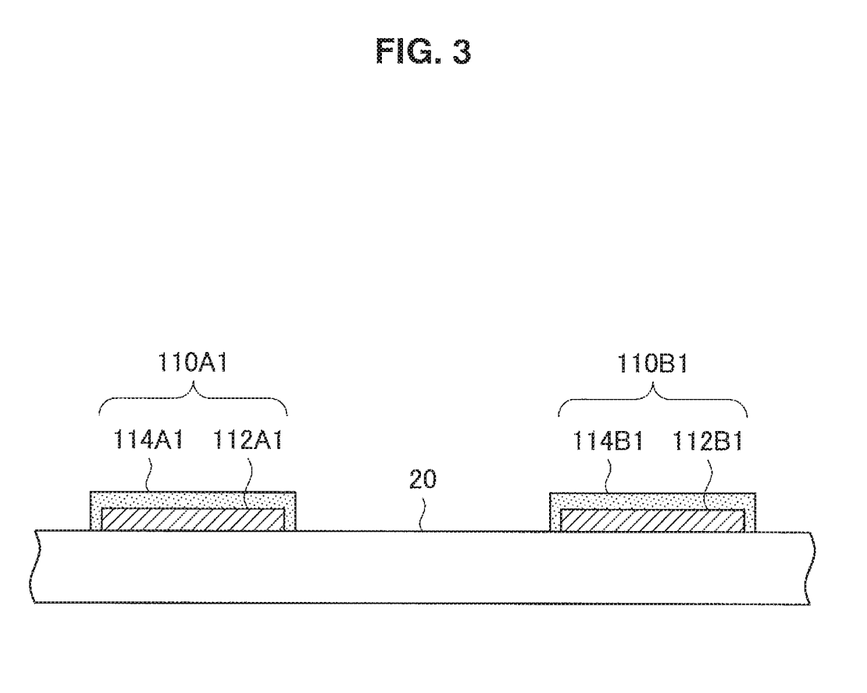
FIG. 3 is a cross-sectional schematic diagram of an AA' line illustrated in FIG. 2 in the electric circuit in the communication device according to the present embodiment.

The external edge portion 114 is electrically connected to the basic portion 112 and the IC chip as a second partial connecting unit. Specifically, the external edge portion 114 is formed so as to cover a part corresponding to the IC chip of the basic portion 112. For example, as illustrated in FIG. 2, an external edge portion 114A1 is formed so as to cover a top surface of the basic portion 112A1. Further, the external edge portion 114A1 is wider than the basic portion 112A1 in a planar view of the electric circuit 100. Further, a specific description will be given of a structure of the external edge portion 114 with reference to FIG. 3. FIG. 3 is a cross-sectional schematic diagram of an AA' line illustrated in FIG. 2 of the electric circuit 100 in the communication device according to the present embodiment.

The external edge portion 114 is formed so as to cover a side surface of the basic portion 112. For example, as illustrated in FIG. 3, the external edge portion 114A1 is formed so as to cover a top surface and both-side surfaces of the basic portion 112A1, and is physically and electrically connected to the top surface and the both-side surfaces of the basic portion 112A1. Further, in other words, the external edge portion 114 is formed at at least a part of the periphery of a corresponding part to the IC chip of the basic portion 112, higher than the basic portion 112. For example, as illustrated in FIG. 3, a part is formed at the periphery of a side surface of the basic portion 112A1 of the external edge portion 114A1 such that the part becomes higher than the basic portion 112A1 in the thickness direction of the electric circuit 100.

Note that, with the example in FIG. 2, the description has been given of the example in which the external edge portion 114A1 covers the entire edge portion of the basic portion 112A1. However, the external edge portion 114 may be a structure that covers a partial edge portion of the basic portion 112. Note that, with the example in FIG. 3, the description has been given of the example in which the external edge portion 114A1 covers the both-side surfaces of the basic portion 112A1. However, the external edge portion 114 may be a structure that covers a partial side surface of the basic portion 112.

Further, the material of the external edge portion 114 is different from the material of the basic portion 112. Specifically, the material of the external edge portion 114 contains copper. For example, the external edge portion 114 is formed by paste printing of a copper material containing copper.

(Case of Forming Basic Portion in a Grid Shape)

Figure 4:
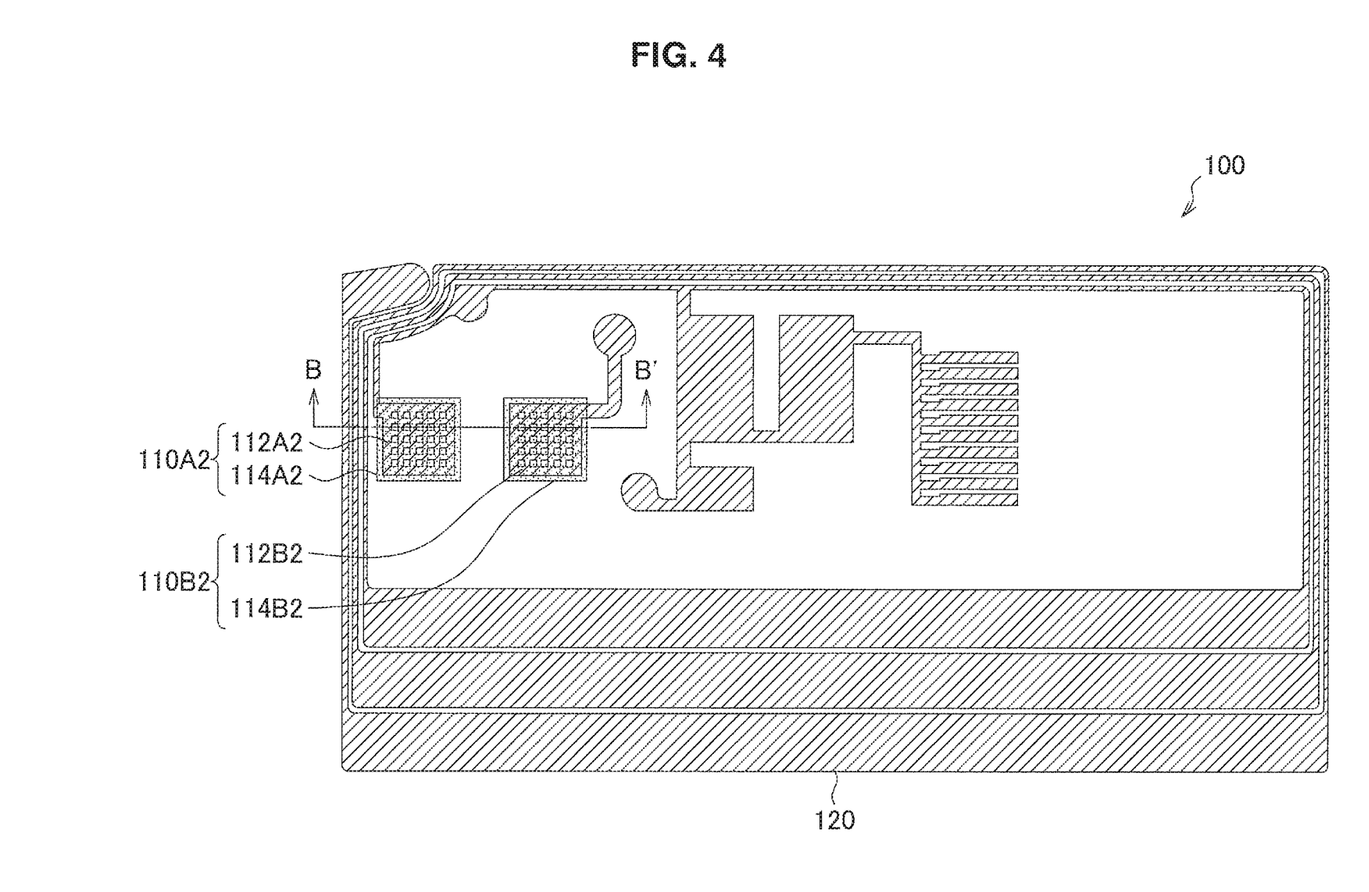
FIG. 4 is a circuitry diagram schematically illustrating another example of the electric circuit in the communication device according to the present embodiment.

The basic portion 112 may have space, and the external edge portion 114 may be provided for the space. Specifically, the basic portion 112 is formed in a grid shape, and the space of the basic portion 112 is an area surrounded by the grids of the basic portion 112. Further, a specific description will be given of the case where the basic portion 112 has the space with reference to FIG. 4. FIG. 4 is a circuitry diagram schematically illustrating another example of the electric circuit 100 in the communication device according to the present embodiment.

Figure 5:
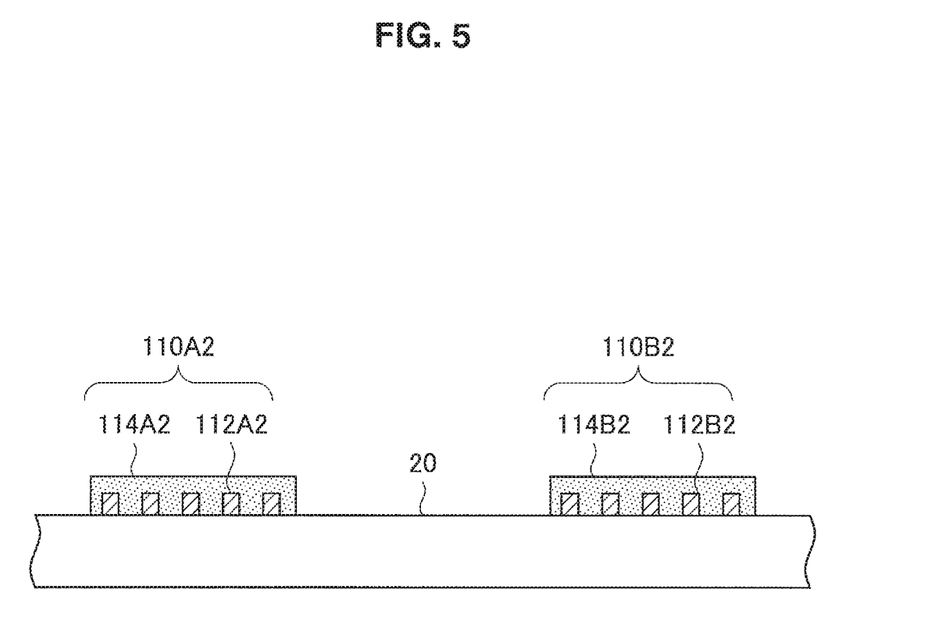
FIG. 5 is a cross-sectional schematic diagram of a BB' line illustrated in FIG. 4 in the electric circuit in the communication device according to the present embodiment.

The basic portion 112 is formed in a grid shape in a planar view of the electric circuit 100. For example, a basic portion 112A2 is formed in a grid shape as illustrated in FIG. 4, having space surrounded by the grids. Note that various forms may naturally be used for the number of grids, aligned direction, shape, and the like. Further, only a part of the basic portion 112 may be formed in a grid shape. Further, a specific description will be given of a state of forming the external edge portion 114 in the space of the basic portion 112 with reference to FIG. 5. FIG. 5 is a cross-sectional schematic diagram of a BB' line illustrated in FIG. 4 in the electric circuit 100 in the communication device according to the present embodiment.

The external edge portion 114 is formed in the space formed by the grids of the basic portion 112. For example, as illustrated in FIG. 5, an external edge portion 114A2 is formed so as to be implanted between grids of the basic portion 112A2, and is physically and electrically connected to side surfaces of the grid as well as the top surface and the both-side surfaces of the basic portion 112A2.

Further, the space between the grids of the basic portion 112 may be a hole that penetrates into the basic portion 112. For example, as illustrated in FIG. 5, the space between the grids of the basic portion 112 penetrates into the basic portion 112A2, and the external edge portion 114 formed in the space comes into contact with the film 20.

(Case of Forming Basic Portion in a Comb Shape)

Figure 6:
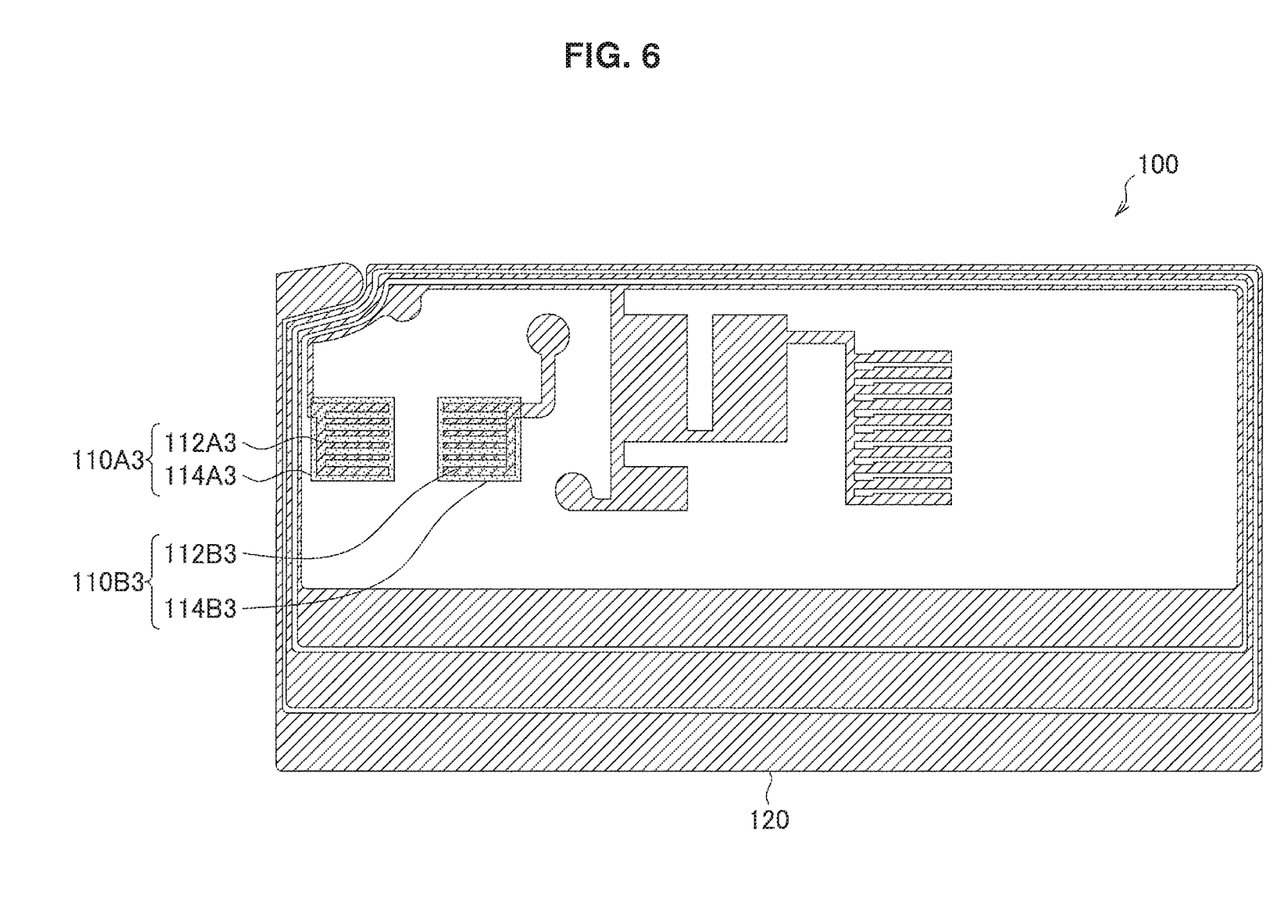
FIG. 6 is a circuitry diagram schematically illustrating another example of the electric circuit in the communication device according to the present embodiment.

The basic portion 112 may be formed with a notch. In this case, the space of the basic portion 112 is the notch. Further, a specific description will be given of the case where the basic portion 112 has the notch with reference to FIG. 6. FIG. 6 is a circuitry diagram schematically illustrating another example of the electric circuit 100 in the communication device according to the present embodiment.

The basic portion 112 is formed so as to have at least one notch in the planar view of the electric circuit 100. For example, as illustrated in FIG. 6, a basic portion 112A3 and a basic portion 112B3 have a plurality of notches like a comb shape facing each other, respectively. Note that various forms may be used for the length and thickness of notch, and number of the notches, notched direction, and notched shape.

Returning to the description as to the configuration of the electric circuit 100 with reference to FIG. 2, the antenna coil 120 generates electric power in the electric circuit 100. Specifically, the antenna coil 120 receives a magnetic field of an operational frequency, thereby generating electromagnetic induction. The electromagnetic induction causes the generation of electric power. For example, the antenna coil 120 is spiral-arranged and is wound at a plurality of turns, for example, 3 turns, as illustrated in FIG. 2.

<2-2. Configuration of Communication Device>

Figure 7:
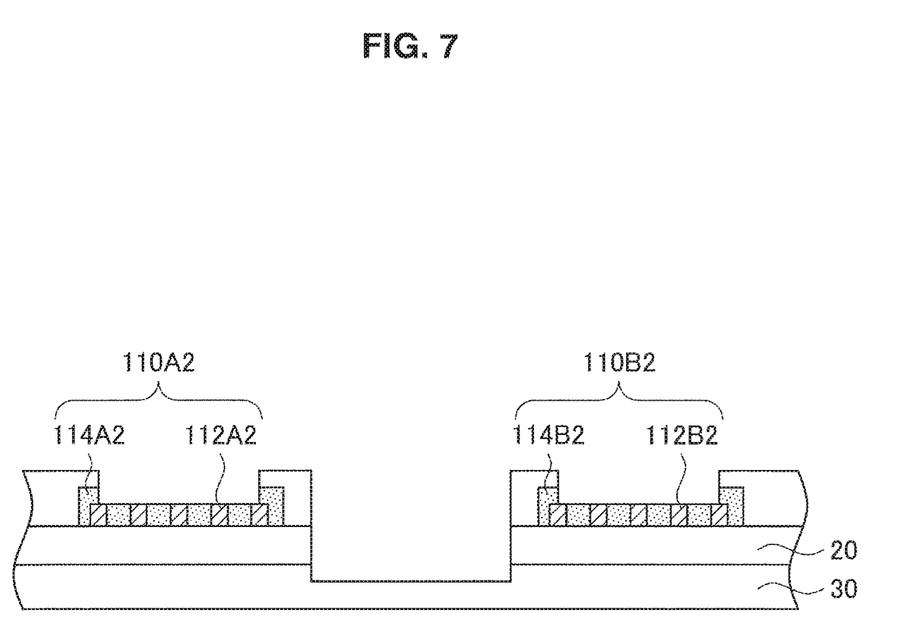
FIG. 7 is a cross-sectional schematic diagram of the communication device before mounting an IC chip according to the present embodiment.
Figure 8:
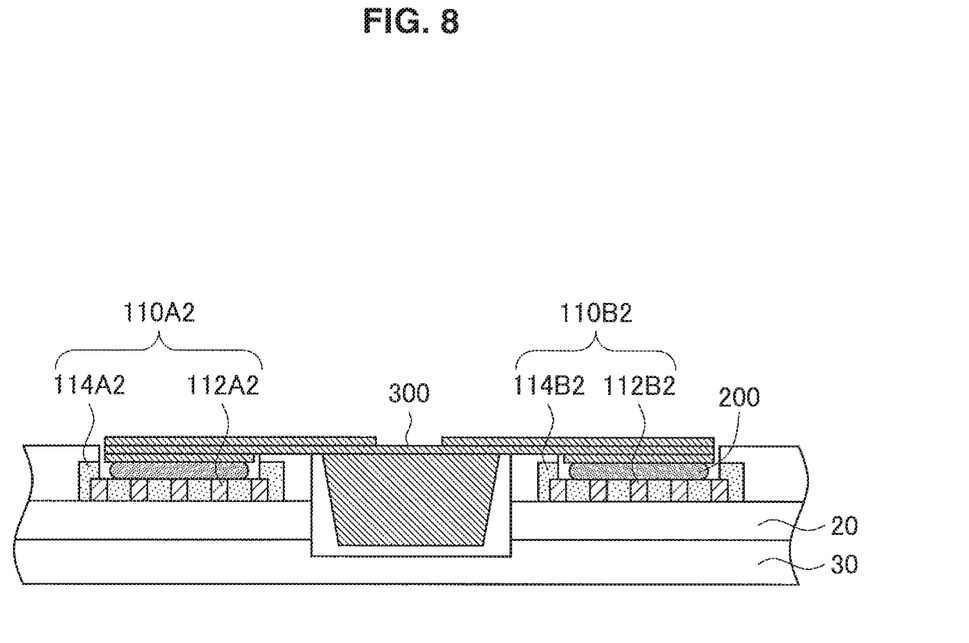
FIG. 8 is a cross-sectional schematic diagram of the communication device after mounting the IC chip according to the present embodiment.

Next, a description will be given of the configuration of the communication device according to the present embodiment with reference to FIGS. 7 and 8. FIG. 7 is a cross-sectional schematic diagram of the communication device before mounting the IC chip according to the present embodiment. FIG. 8 is a cross-sectional schematic diagram of the communication device after mounting the IC chip according to the present embodiment. Note that, hereinbelow, a description will be given by using an example in which the basic portion 112 is formed in a grid shape.

The communication device according to the present embodiment includes the electric circuit 100, a card unit 30, and an IC chip 300. Note that the electric circuit 100 is as described above and a description thereof is thus omitted.

The card unit 30 includes the electric circuit 100. For example, the material of the card unit 30 is resin, plastic. The electric circuit 100 is embedded into the card unit 30, and the electric circuit 100 is thus included. Note that the electric circuit 100 may be fit into the card unit 30, and resin may be casted around the electric circuit 100, thereby including the electric circuit 100 in the card unit 30. Further, the material of the card unit 30 may be another material.

The IC chip 300 is attached to the card unit 30 and the electric circuit 100 so as to be electrically connected to at least the electric circuit 100. Specifically, the IC chip 300 is attached to the connecting unit 110 of the electric circuit 100 included in the card unit 30 so as to be electrically connected to the connecting unit 110.

More specifically, first, the card unit 30 including the electric circuit 100 is cut so as to expose the connecting unit 110 of the electric circuit 100. For example, as illustrated in FIG. 7, the card unit 30 is cut so as to expose a connecting unit 110A2 of the electric circuit 100. Note that a part of the external edge portion 114 in the connecting unit 110 is pruned by cutting. For example, as illustrated in FIG. 7, a part of the top of the external edge portion 114A2 is cut, thereby exposing the basic portion 112A2. The cutting may naturally be performed at the level that the basic portion 112A2 is not exposed.

Next, the IC chip 300 is mounted on the connecting unit 110 that is exposed by cutting. Herein, the IC chip 300 and the connecting unit 110 are electrically connected via a conductor 200 as a third partial connecting unit. For example, the conductor 200 is formed between the IC chip 300 and the connecting unit 110A2, that is, the basic portion 112A2 and the external edge portion 114. With thermal crimping, the IC chip 300, the basic portion 112A2, and the external edge portion 114 are electrically connected via the conductor 200.

Note that the material of the conductor 200 is different from the materials of the basic portion 112 and the external edge portion 114. Specifically, the material of the conductor 200 contains silver. For example, the conductor 200 may be a paste material containing silver.

Further, the IC chip and the basic portion 112 may be electrically connected via the external edge portion 114 that is formed in at least a part around a corresponding portion to the IC chip of the basic portion 112. For example, FIG. 8 illustrates an example in which the conductor 200 is in contact with only the top surface of the connecting unit 110A2. However, in the case where a part of the connecting unit 110 is pruned by cutting, the conductor 200 may be formed so as to be in contact with a side surface of a recessed portion of the connecting unit 110, generated by cutting.

In this case, the external edge portion 114 formed at the periphery of the side surface of the basic portion 112 is formed as a side surface of the recessed portion of the connecting unit 110. Therefore, the conductor 200 and the basic portion 112 are electrically connected via the external edge portion 114 formed at the periphery of the side surface of the basic portion 112. That is, the IC chip 300 and the basic portion 112 are electrically connected via the external edge portion 114 formed at the periphery of the side surface of the basic portion 112.

<2-3. Method for Manufacturing Communication Device>

Figure 9:
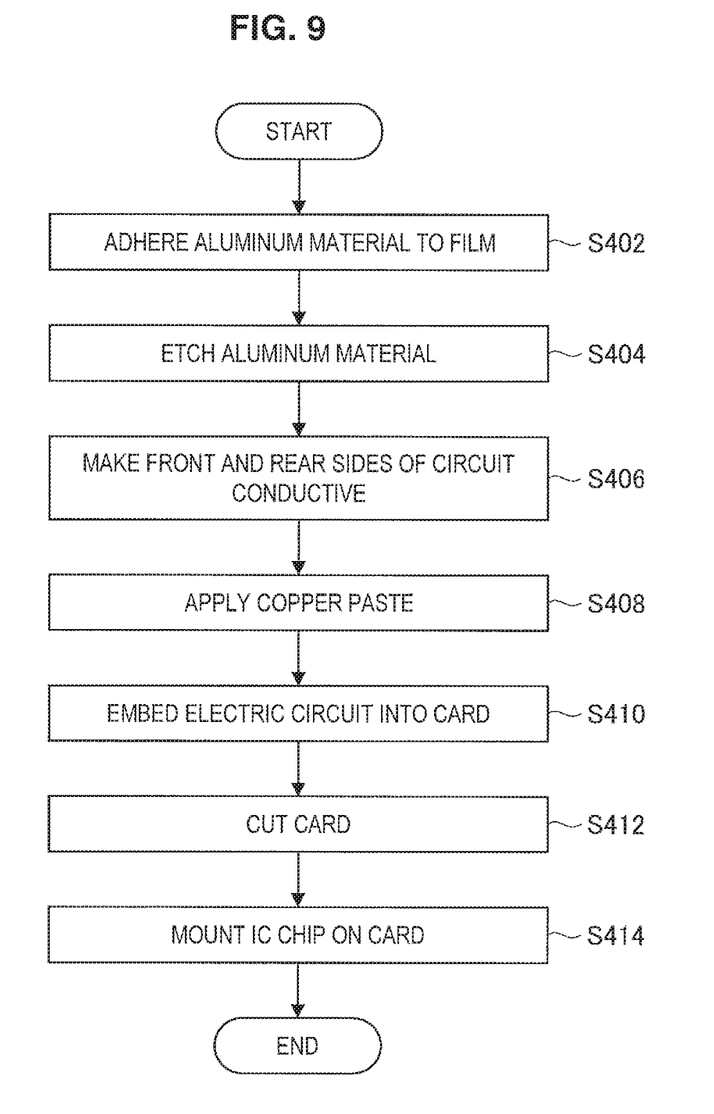
FIG. 9 is a flowchart conceptually illustrating a process for manufacturing the communication device according to the present embodiment.

Next, a description will be given of a method for manufacturing the aforementioned communication device with reference to FIG. 9. FIG. 9 is a flowchart conceptually illustrating a process for manufacturing the communication device according to the present embodiment.

First, an aluminum material is adhered to the film 20 (step S402). Specifically, the basic portion 112 and the aluminum material to be the antenna coil 120 are adhered to both sides of the film 20 including polyethylene terephthalate (PET) or the like as the material, thereby generating a raw board of the electric circuit 100.

Next, the aluminum material is etched (step S404). Specifically, resist for etching is applied to the aluminum material of the raw board, corresponding to the shape of the formed basic portion 112 and antenna coil 120. Next, the raw board to which the resist is applied is etched, thereby resolving the aluminum material to which the resist is not applied. Further, the resist applied to the raw board is peeled, and the electric circuit 100 is thus formed, including the basic portion 112 and the antenna coil 120.

Next, the front and rear sides of the electric circuit 100 are made conductive (step S406). Specifically, shape corresponding to the front and rear sides of the film 20, for example, a conductive unit of the electric circuit 100 formed with recessed and projected shape is pressurized in the thickness direction of the electric circuit 100, thereby fitting the conductive unit and making the front and rear sides of the electric circuit 100 conductive.

Next, the copper paste is applied (step S408). Specifically, the copper paste is applied so as to cover the basic portion 112. Note that, when the basic portion 112 has space, the copper paste is filled into the space.

Next, the electric circuit 100 is embedded into the card unit 30 (step S410). Specifically, the electric circuit 100 to which the copper paste is applied is embedded in the card unit 30.

Next, the card unit 30 is cut (step S412). Specifically, a part adjacent to the top surface of the connecting unit 110 of the electric circuit 100 in the card unit 30 including the electric circuit 100 is cut. Note that at least a part of the connecting unit 110 is cut to be exposed from the card unit 30.

Next, the IC chip is mounted on the card unit 30 (step S414). Specifically, the conductor 200 is applied to the connecting unit 110 exposed by cutting the card unit 30, and the IC chip is crimped to the conductor 200, thereby attaching the IC chip to the card unit 30.

3. CONCLUSION

As described above, according to the embodiment of the present disclosure, the electric circuit 100 includes the connecting unit 110 that electrically connects the antenna coil 120 and the IC chip 300. The connecting unit 110 includes the first partial connecting unit that is electrically connected to the antenna coil 120 and the second partial connecting unit that is electrically connected to the first partial connecting unit and the IC chip 300 arranged and has a material different from the material of the first partial connecting unit. Therefore, only the connecting part of the IC chip 300 and the antenna coil 120 in the electric circuit 100 is formed to contain a material different in easiness of oxidization, for example, a material containing copper, thereby maintaining or improving the connection reliability while suppressing the increase in manufacturing costs.

Further, the first partial connecting unit has space, and the second partial connecting unit is formed in the space. Herein, in the cutting of the card unit 30 in the manufacturing step of the communication device described above, generally, the cutting stops on the basis of detection of change of electric characteristics of a cut surface. For example, a cutting machine performs cutting while determining whether the electric characteristics are changed on the cut surface. However, the cutting continues, while the cut surface reaches the connecting unit 110 (external edge portion 114) and the change of the electric characteristics is detected, and then, the cutting stops. Therefore, the connecting unit 110 may be cut. In this case, when the external edge portion 114 of the top surface of the basic portion 112 is totally cut, the connection reliability may become difficult to be improved. On the other hand, with the present structure, even if the external edge portion 114 formed on the top surface of the basic portion 112 is totally cut, the external edge portion 114 remains in the space of the basic portion 112. Therefore, the basic portion 112 and the IC chip 300 are electrically connected via the remaining external edge portion 114, thereby enabling improvement of the connection reliability. Further, without changing the cutting step described above, the connection reliability may be improved. Furthermore, a contact area of the basic portion 112 and the external edge portion 114 is more increased than the case where the space is not provided, the conductivity between the basic portion 112 and the external edge portion 114 is improved and the connection reliability may be improved.

Further, the first partial connecting unit is formed in a grid shape, and the space includes an area surrounded by the grids of the first partial connecting unit. Therefore, by fixing the basic portion 112 and the external edge portion 114 with the space surrounded by the grids, the connecting characteristics between the basic portion 112 and the external edge portion 114 may be strengthened.

Furthermore, the first partial connecting unit is formed so as to have a notch. The space includes the notch. Therefore, by more increasing the area per surface where the basic portion 112 is in contact with the external edge portion 114 as compared with the case where the basic portion 112 is formed in a grid shape, the conductivity between the basic portion 112 and the external edge portion 114 is improved, and the connection reliability may be improved. Further, when the external edge portion 114 is paste-printed, the external edge portion 114 may be easily filled into the notch, that is, the space, by paste printing in the notched direction.

In addition, the space includes a hole that penetrates into the first partial connecting unit. Therefore, as compared with the formation without the penetration into the basic portion 112, the basic portion 112 may be easily manufactured.

In addition, the material of the first partial connecting unit contains aluminum, and the material of the second partial connecting unit contains copper. Therefore, copper is used for only the external edge portion 114, and aluminum cheaper than copper is used for the basic portion 112. Thus, it is possible to reduce manufacturing costs of the electric circuit 100 or the communication device while ensuring the connection reliability of the external edge portion 114 that is directly connected to the IC chip 300.

In addition, the second partial connecting unit is formed so as to cover a part corresponding to the IC chip 300 of the first partial connecting unit. Herein, in conductivity inspection of the connecting unit 110 of the electric circuit 100, the connecting unit 110 and the wiring for connecting the connecting unit 110 and the antenna coil 120 may be pressed. In this case, even if the basic portion 112 and the external edge portion 114 are actually non-contact with each other, when an overlapped part of the basic portion 112 and the external edge portion 114 is pressed, the two portions may come into contact by pressing, and such abnormality of the non-contact state may not be found in the conductivity inspection. On the other hand, with the present configuration, a part that is not overlapped to the basic portion 112 is formed in the external edge portion 114, and the conductivity may thus be inspected by pressing the part that is not overlapped. The possibility for missing the abnormality in the conductivity inspection may be reduced.

In addition, the second partial connecting unit is formed at at least a part of the periphery of a corresponding portion to the IC chip 300 in the first partial connecting unit, higher than the first partial connecting unit. The IC chip 300 and the first partial connecting unit are electrically connected via the second partial connecting unit that is formed at at least a part of the periphery of the corresponding portion. Therefore, even if the space is not provided for the basic portion 112 and the external edge portion 114 formed by the above-described cutting to the top surface of the corresponding part to the IC chip 300 of the basic portion 112 is totally cut, the IC chip 300 and the basic portion 112 may be electrically connected via the external edge portion 114.

In addition, the IC chip 300 and the second partial connecting unit are electrically connected via a third partial connecting unit. Therefore, the connection reliability may be ensured even if the configuration of direct connection to the external edge portion 114 is not provided for the IC chip 300.

In addition, the material of the third partial connecting unit includes a material different from the materials of the first partial connecting unit and the second partial connecting unit. Therefore, it is possible to adjust the connection reliability and manufacturing costs by selecting a suitable material corresponding to desired connection reliability and manufacturing costs.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, according to the above-described embodiment, the space provided for the basic portion 112 penetrates into the basic portion 112. However, the present technology is not limited to the above example. For example, the space may not penetrate into the basic portion 112. For example, the space may be a groove that does not penetrate into the basic portion 112. In this case, as compared with the case where the space penetrates into the basic portion 112, the contact area of the basic portion 112 and the external edge portion 114 is increased. Thus, the conductivity may be improved and the connection reliability may be improved. Note that the groove may be formed with the grids described above, the notch, or another form.

According to the above-described embodiment, the description has been given of the example in which the space of the basic portion 112 is formed to have grids of the basic portion 112 or the notch. However, the space may be variously formed within an adoptable range. For example, the space may be spiral-shaped, concentric-circular-shaped, or concentric-polygonal-shaped.

Further, according to the above-described embodiment, the description has been given of the example in which the IC chip 300 is electrically connected to the connecting unit 110 via the conductor 200. However, the IC chip 300 may be directly connected to the connecting unit 110. For example, a projected portion for connection to the connecting unit 110 is arranged to the IC chip 300, and a recessed portion corresponding to the projected portion is arranged to the connecting unit 110. Further, by fitting the projected portion into the recessed portion, the IC chip 300 and the connecting unit 110 are physically and electrically connected. Note that, in place of the recession and projection, a terminal may be used.

Further, the effects described in this specification are merely illustrative or exemplified effects, and are not limitative. That is, with or in the place of the above effects, the technology according to the present disclosure may achieve other effects that are clear to those skilled in the art from the description of this specification.

Further, not only a process in which steps shown in the flowcharts of the above embodiments are performed in a time-series manner in accordance with a described sequence but also a process in which the steps are not necessarily processed in a time-series manner but are executed in parallel or individually is included. Also, it is self-evident that even steps processed in a time-series manner can be appropriately changed in sequence depending on circumstances.

Additionally, the present technology may also be configured as below.

(1)

An electric circuit including:
a connecting unit that electrically connects an antenna coil and an integrated circuit (IC) chip,
in which the connecting unit includes
a first partial connecting unit that is electrically connected to the antenna coil, and
a second partial connecting unit that is electrically connected to the first partial connecting unit and the IC chip to be arranged and that is made of a material different from a material of the first partial connecting unit.

(2)

The electric circuit according to (1),
in which the first partial connecting unit has space, and
the second partial connecting unit is formed in the space.

(3)

The electric circuit according to (2),
in which the first partial connecting unit is formed in a grid shape, and
the space includes an area surrounded by the grid of the first partial connecting unit.

(4)

The electric circuit according to (2) or (3),
in which the first partial connecting unit is formed to have a notch, and
the space includes the notch.

(5)

The electric circuit according to any one of (2) to (4),
in which the space includes a hole that penetrates into the first partial connecting unit.

(6)

The electric circuit according to any one of (1) to (5),
in which the material of the first partial connecting unit contains aluminum, and
the material of the second partial connecting unit contains copper.

(7)

The electric circuit according to any one of (1) to (6),
in which the second partial connecting unit is formed to cover a part corresponding to the IC chip of the first partial connecting unit.

(8)

The electric circuit according to any one of (1) to (7),
in which the second partial connecting unit is formed at at least a part of periphery of a corresponding part to the IC chip of the first partial connecting unit, such that the second partial connecting unit is higher than the first partial connecting unit, and
the IC chip and the first partial connecting unit are electrically connected via the second partial connecting unit formed at at least a part of the periphery of the corresponding part.

(9)

The electric circuit according to any one of (1) to (8),
in which the IC chip and the second partial connecting unit are electrically connected via a third partial connecting unit.

(10)

The electric circuit according to (9),
in which a material of the third partial connecting unit contains a material different from the materials of the first partial connecting unit and the second partial connecting unit.

(11)

A communication device including:
an antenna coil;
an integrated circuit (IC) chip; and
a connecting unit that electrically connects the antenna coil and the IC chip,
in which the connecting unit includes
a first partial connecting unit that is electrically connected to the antenna coil, and
a second partial connecting unit that is electrically connected to at least a part of the first partial connecting unit and at least a part of the IC chip to be arranged and that is made of a material different from a material of the first partial connecting unit.

(12)

A method for manufacturing an electric circuit, the method including:
forming an antenna coil and a first partial connecting unit that is electrically connected to the antenna coil; and
forming a second partial connecting unit that is electrically connected to at least a part of the first partial connecting unit and at least a part of the IC chip to be arranged, by applying a material different from a material of the first partial connecting unit to the first partial connecting unit.

REFERENCE SIGNS LIST 100 electric circuit
110 connecting unit
112 basic portion
114 external edge portion
120 antenna coil
200 conductor
300 IC chip

The invention claimed is:

1. An electric circuit, comprising:
a connecting unit configured to electrically connect an antenna coil and an integrated circuit (IC) chip, wherein
the connecting unit includes:
a first partial connecting unit that is electrically connected to the antenna coil, wherein the first partial connecting unit comprises a first material, and
a second partial connecting unit that is electrically connected to the first partial connecting unit and the IC chip, wherein
the second partial connecting unit covers a top surface of the first partial connecting unit and both side surfaces of the first partial connecting unit,
the second partial connecting unit comprises a second material,
the first material is different from the second material,
at least a portion of the first partial connecting unit has a grid shape,
the grid shape includes a plurality of grids, and
the second partial connecting unit is between the plurality of grids of the first partial connecting unit.

2. The electric circuit according to claim 1, wherein the first partial connecting unit has a plurality of notches.

3. The electric circuit according to claim 1, wherein
the first material contains aluminum, and
the second material contains copper.

4. The electric circuit according to claim 1, wherein the top surface of the first partial connecting unit is electrically connected to the IC chip.

5. The electric circuit according to claim 1,
wherein the IC chip and the second partial connecting unit are electrically connected via a third partial connecting unit.

6. The electric circuit according to claim 5,
wherein a third material of the third partial connecting unit is different from the first material and the second material.

7. A communication device, comprising:
an antenna coil;
an integrated circuit (IC) chip; and
a connecting unit configured to electrically connect the antenna coil and the IC chip, wherein
the connecting unit includes:
- a first partial connecting unit that is electrically connected to the antenna coil, wherein the first partial connecting unit comprises a first material, and
- a second partial connecting unit that is electrically connected to at least a part of the first partial connecting unit and at least a part of the IC chip, wherein
the second partial connecting unit covers a top surface of the first partial connecting unit and both side surfaces of the first partial connecting unit,
the second partial connecting unit comprises a second material,
the first material is different from the second material,
at least a portion of the first partial connecting unit has a grid shape,
the grid shape includes a plurality of grids, and
the second partial connecting unit is between the plurality of grids of the first partial connecting unit.

8. A method for manufacturing an electric circuit, the method comprising:
forming an antenna coil;
forming a first partial connecting unit that is electrically connected to the antenna coil, wherein the first partial connecting unit comprises a first material; and
forming a second partial connecting unit that is electrically connected to at least a part of the first partial connecting unit and at least a part of an Integrated Circuit (IC) chip, wherein
the second partial connecting unit covers a top surface of the first partial connecting unit and both side surfaces of the first partial connecting unit,
the second partial connecting unit comprises a second material,
the first material is different from the second material,
at least a portion of the first partial connecting unit has a grid shape,
the grid shape includes a plurality of grids, and
the second partial connecting unit is between the plurality of grids of the first partial connecting unit.

9. The electric circuit according to claim 6, wherein the third material contains silver.

* * * * *